United States Patent
Van Santen et al.

(10) Patent No.: US 7,490,547 B2
(45) Date of Patent: Feb. 17, 2009

(54) IMPRINT LITHOGRAPHY

(75) Inventors: Helmar Van Santen, Amsterdam (NL); Aleksey Yurievich Kolesnychenko, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1 day.

(21) Appl. No.: 11/025,605

(22) Filed: Dec. 30, 2004

(65) Prior Publication Data

US 2006/0150849 A1    Jul. 13, 2006

(51) Int. Cl.
*B41M 5/00* (2006.01)
*G03G 13/26* (2006.01)

(52) U.S. Cl. ............ 101/463.1; 101/483; 101/488; 101/453; 430/49.1; 430/49.4; 216/44; 216/52

(58) Field of Classification Search .......... 216/44, 216/52, 40, 53; 427/235, 238; 977/887, 977/888; 101/488, 463.1, 453; 430/49.1, 430/49.4, 49.43
See application file for complete search history.

(56) References Cited

U.S. PATENT DOCUMENTS

| | | | |
|---|---|---|---|
| 4,101,324 A * | 7/1978 | Mizuno et al. | 430/306 |
| 5,202,008 A * | 4/1993 | Talieh et al. | 204/192.32 |
| 5,397,421 A * | 3/1995 | Fujutani | 156/345.1 |
| 5,512,131 A | 4/1996 | Kumar et al. | 156/655.1 |
| 5,772,905 A | 6/1998 | Chou | 216/44 |
| 6,165,911 A | 12/2000 | Calveley | 438/754 |
| 6,309,580 B1 | 10/2001 | Chou | 264/338 |
| 6,334,960 B1 * | 1/2002 | Willson et al. | 216/52 |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,518,189 B1 | 2/2003 | Chou | 438/706 |
| 6,656,341 B2 | 12/2003 | Petersson et al. | 205/667 |
| 6,696,220 B2 | 2/2004 | Bailey et al. | 430/272.1 |
| 6,719,915 B2 | 4/2004 | Willson et al. | 216/44 |
| 6,799,584 B2 * | 10/2004 | Yogev et al. | 134/1.3 |
| 6,805,054 B1 * | 10/2004 | Meissl et al. | 101/483 |
| 6,908,567 B2 * | 6/2005 | Uziel | 216/66 |
| 6,921,615 B2 | 7/2005 | Sreenivasan et al. | 430/22 |
| 6,923,923 B2 * | 8/2005 | Cheon et al. | 252/512 |
| 6,954,275 B2 * | 10/2005 | Choi et al. | 356/614 |
| 2002/0093122 A1 | 7/2002 | Choi et al. | 264/401 |
| 2002/0094496 A1 | 7/2002 | Choi et al. | 430/322 |
| 2002/0122106 A1 * | 9/2002 | Ylitalo | 347/102 |
| 2002/0132482 A1 | 9/2002 | Chou | 438/692 |

(Continued)

FOREIGN PATENT DOCUMENTS

WO        WO 01/79591 A1    10/2001

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

*Primary Examiner*—Leslie J Evanisko
*Assistant Examiner*—Matthew G Marini
(74) *Attorney, Agent, or Firm*—Pillsbury Winthrop Shaw Pittman LLP

(57) ABSTRACT

An imprinting method is provided that, according to an embodiment, involves contacting an imprintable medium on a substrate with a template to define an imprint area in the medium, removing at least some of any imprintable medium present outside the imprint area, and separating the template from the medium.

26 Claims, 6 Drawing Sheets

U.S. PATENT DOCUMENTS

| | | | |
|---|---|---|---|
| 2002/0167117 A1 | 11/2002 | Chou | 264/338 |
| 2002/0177319 A1 | 11/2002 | Chou | 438/690 |
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0167948 A1* | 9/2003 | Weitz | 101/425 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |

FOREIGN PATENT DOCUMENTS

| | | |
|---|---|---|
| WO | WO 01/79592 A1 | 10/2001 |

* cited by examiner

IMPRINT LITHOGRAPHY

FIELD

The invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of a short wavelength. However, there are problems associated with such reductions. Lithographic apparatus using 193 nm wavelength radiation are starting to be adopted but even at this level, diffraction limitations may become a barrier. At lower wavelengths, the transparency of projection system materials is poor. Thus, optical lithography capable of enhanced resolution will likely require complex optics and rare materials and thus will be expensive.

An alternative method to printing sub-100 nm features, known as imprint lithography, comprises transferring a pattern to a substrate by imprinting a pattern into an imprintable medium using a physical mould or template. The imprintable medium may be the substrate or a material coated onto a surface of the substrate. The imprintable medium may be functional or may be used as a "mask" to transfer a pattern to an underlying surface. The imprintable medium may, for instance, be provided as a resist deposited on a substrate, such as a semiconductor material, to which the pattern defined by the template is to be transferred. Imprint lithography is thus essentially a moulding process on a micrometer or nanometer scale in which the topography of a template defines the patterns created on a substrate. Patterns may be layered as with optical lithography processes so that in principle imprint lithography could be used for such applications as integrated circuit manufacture.

The resolution of imprint lithography is limited only by the resolution of the template fabrication process. For instance, imprint lithography has been used to produce features in the sub-50 nm range with good resolution and line edge roughness. In addition, imprint processes may not require the expensive optics, advanced illumination sources or specialized resist materials typically required for optical lithography processes.

SUMMARY

According to an aspect of the invention, there is provided an imprinting method, comprising:

contacting an imprintable medium on a substrate with a template to define an imprint area in the medium;

removing at least some of any imprintable medium present outside the imprint area; and separating the template from the medium.

Thus, an embodiment of the invention may provide a method for reducing the amount of substrate surface area wasted during imprinting by removing excess imprintable medium outside the imprinted area. In an embodiment, excess medium removed from the substrate surface may be recycled in which case the amount of imprintable medium wasted during imprinting may also be reduced.

In an embodiment, the method may further comprise providing a volume of the imprintable medium on the substrate.

In an embodiment, the method further comprises converting a region of the medium within the imprint area from a flowable state to a substantially non-flowable state while the medium is contacted by the template. In an embodiment, the region is at least the majority, if not substantially all, of the imprintable medium within the imprint area.

In an embodiment, removing the imprintable medium outside the imprint area is effected during conversion of the region of the medium from a flowable state to a substantially non-flowable state. Alternatively, removing the imprintable medium outside the imprint area may be effected after conversion of the region of the medium from a flowable state to a substantially non-flowable state.

In an embodiment, removing the imprintable medium outside the imprint area is effected prior to separating the template from the medium.

In an embodiment, the method further comprises converting only the medium within the imprint area from a flowable state to a substantially non-flowable state while the medium is contacted by the template. Thus, any flowable medium outside the imprint area will remain flowable and may be more easily removed than if it was in a non-flowable state.

Conveniently, removing the imprintable medium outside the imprint area may be effected during conversion of the medium within the imprint area from a flowable state to a substantially non-flowable state. In the alternative, removing the imprintable medium outside the imprint area may be effected after conversion of the medium within the imprint area from a flowable state to a substantially non-flowable state.

In an embodiment, removing the imprintable medium outside the imprint area is effected prior to separating the template from the medium.

In an embodiment, removing the imprintable medium outside the imprint area is effected after initially contacting the medium with the template.

In an embodiment, removing the imprintable medium outside the imprint area is effected by directing a stream of high pressure fluid at the imprintable medium outside the imprint area. In an embodiment, the method may further comprise directing removed imprintable medium along a low pressure conduit. In an embodiment, the high pressure fluid is a gas but may be a liquid.

In an embodiment, removing the imprintable medium outside the imprint area may be effected by subjecting the imprintable medium to be removed to a suction force.

In an embodiment, a first volume of the medium is imprinted to define a first imprint area and then a second volume of the medium is imprinted, and removing imprintable medium outside the first imprint area is effected after separating the template from the first volume and before contacting the second volume with the template. Thus, in an embodiment, the method may form part of a step and repeat process.

According to an aspect of the invention, there is provided an imprinting apparatus, comprising:

a substrate holder configured to hold a substrate having thereon an imprintable medium;

a template holder configured to cause a template supported by the template holder to contact the medium to define an imprint area in the medium and to cause the template to separate from the medium; and a removal apparatus configured to remove at least some of any imprintable medium present outside the imprint area.

Thus, in an embodiment of the invention, the removal apparatus may be operated to remove excess imprintable medium which would otherwise waste valuable area on the substrate surface.

In an embodiment, the apparatus further comprises a dosing apparatus configured to provide the volume of imprintable medium on the substrate.

In an embodiment, the removal apparatus comprises a high pressure channel and a low pressure channel, the high and low pressure channels, when in use, configured to intersect adjacent a region of any imprintable medium present outside the imprint area. The removal apparatus may comprise a plurality of high pressure channels and/or a plurality of low pressure channels.

In an embodiment, the removal apparatus comprises a suction device arranged to apply a suction force to a region of any imprintable medium present outside the imprint area. The removal apparatus may be fixed relative to the template, or movable independently of the template.

In an embodiment, the apparatus further comprises a shield configured to shield any flowable imprintable medium present outside the imprint area from being converted to a substantially non-flowable state. This may provide easier removal of imprintable material since it is typically easier to remove flowable imprintable medium than substantially non-flowable (i.e. cured or solidified) imprintable medium.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
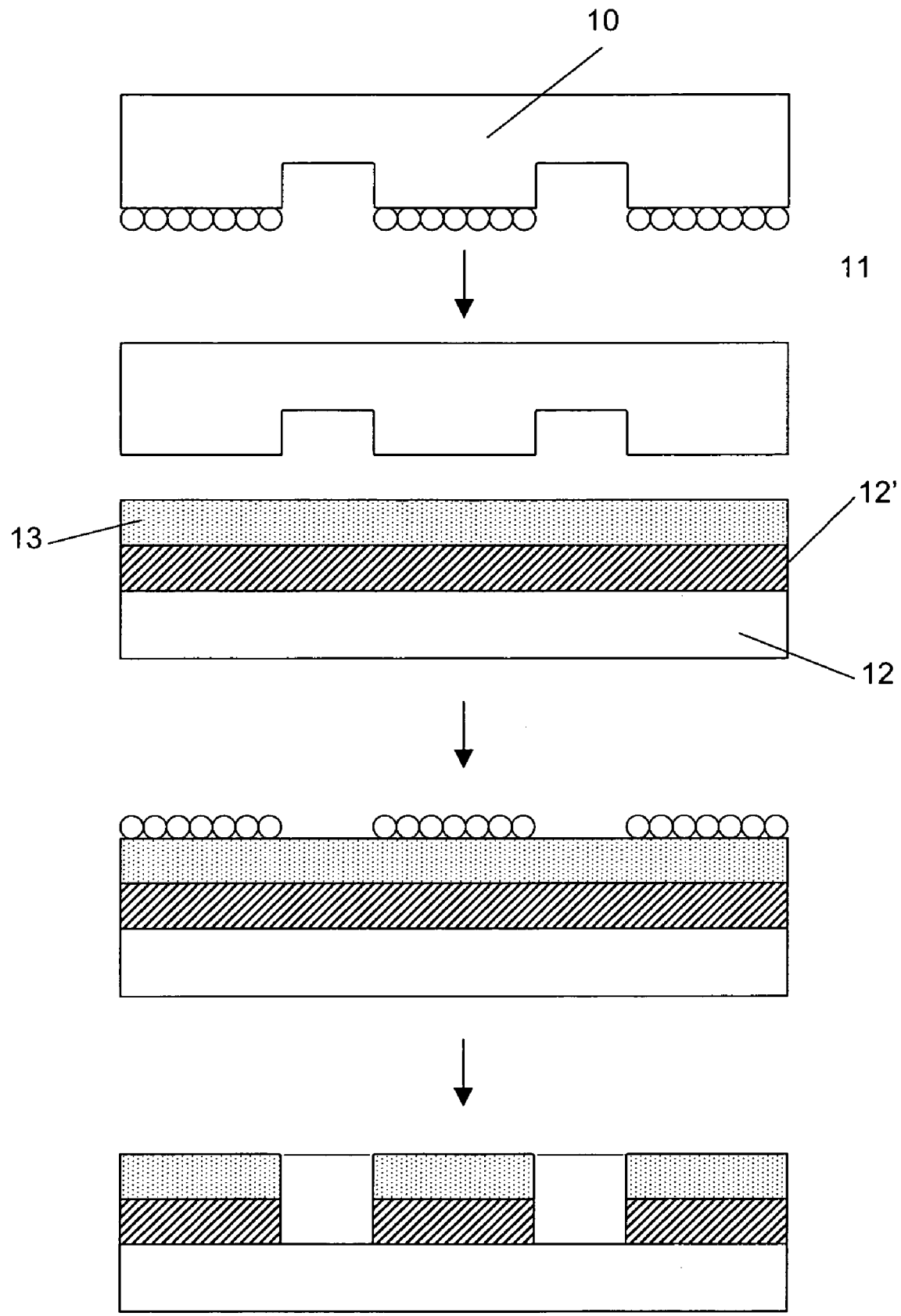
FIG. 1a-1c illustrate examples of soft, hot and UV lithography processes respectively.
Figure 1B:
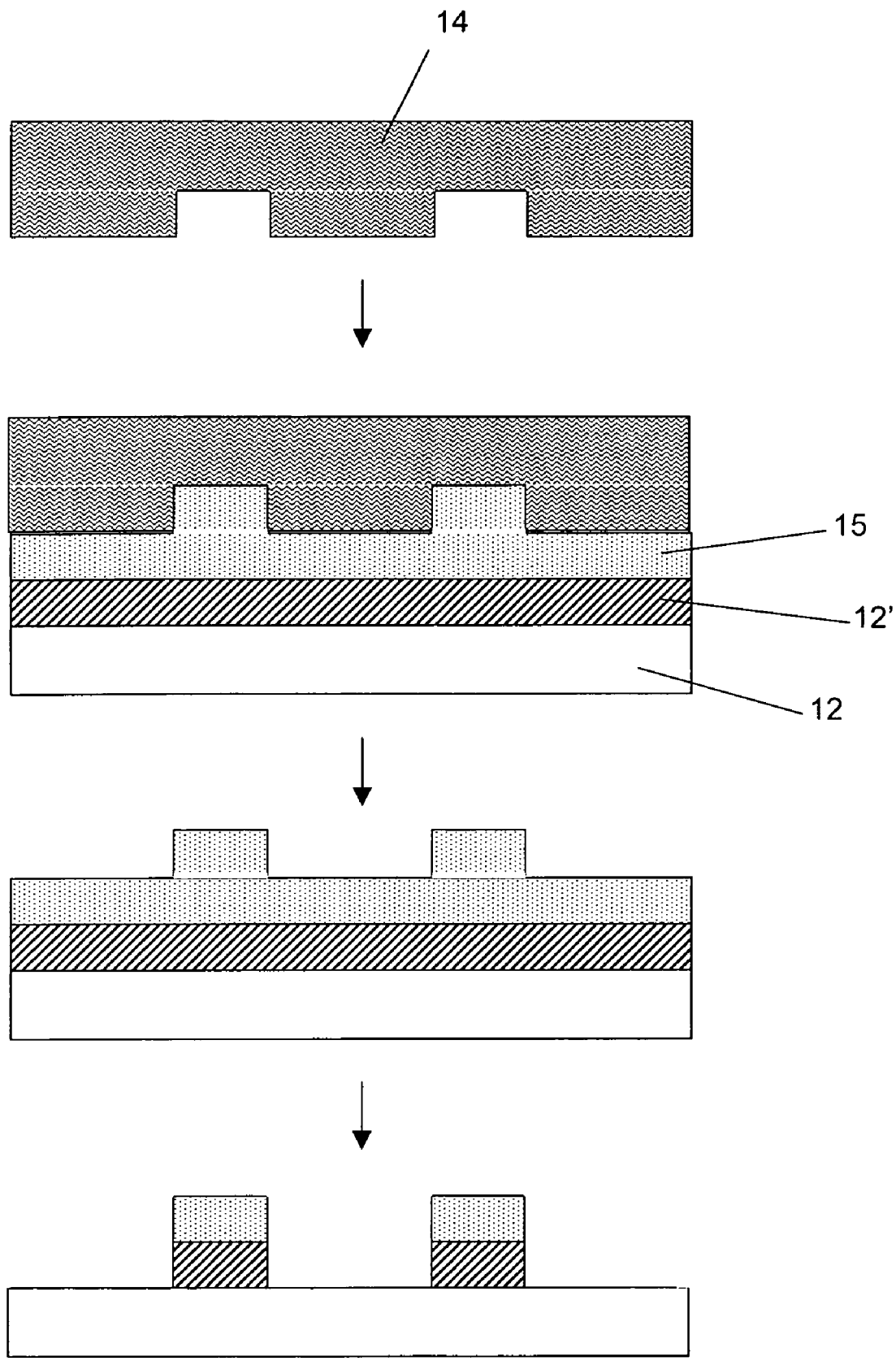
Figure 1C:
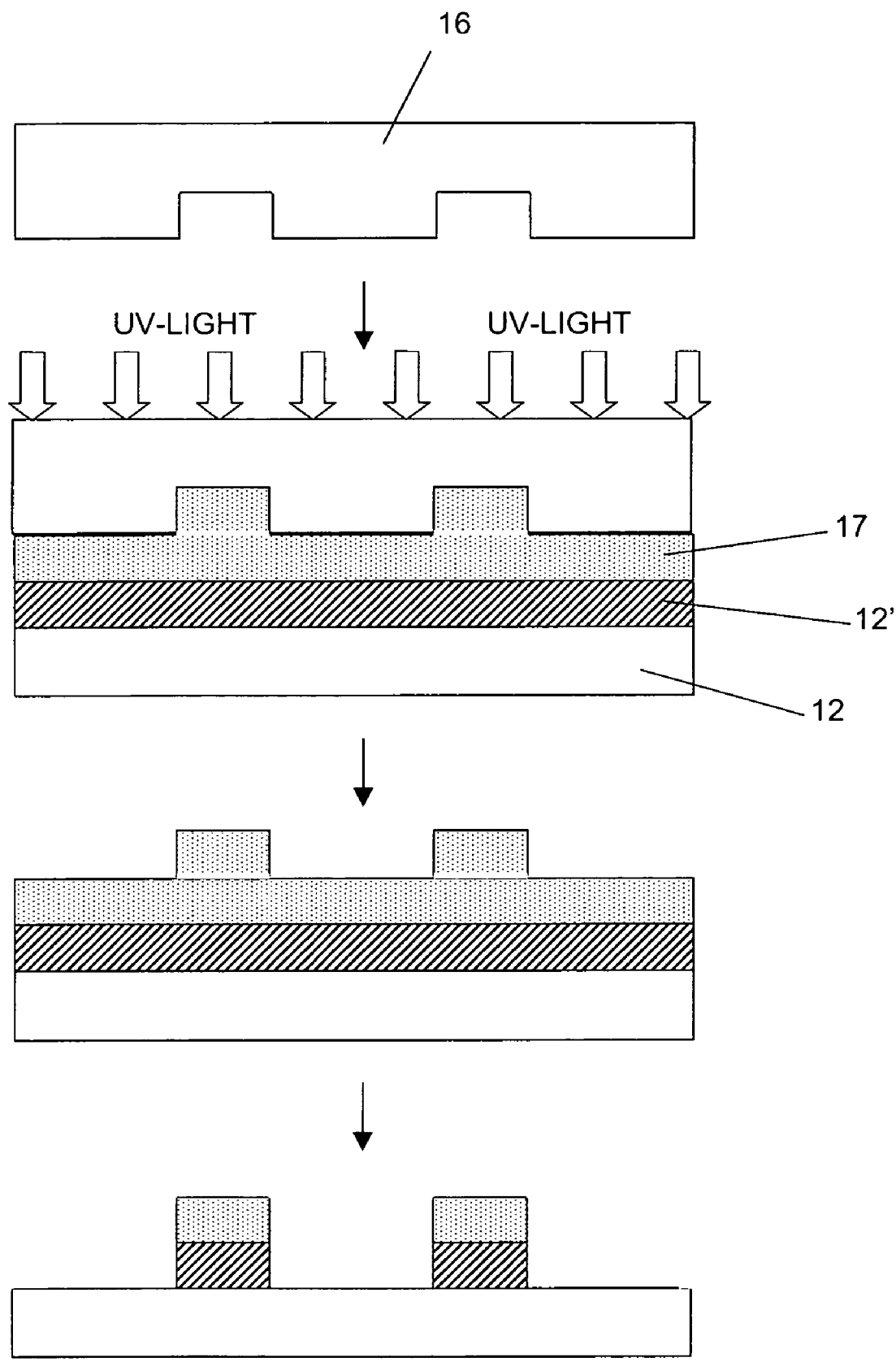

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
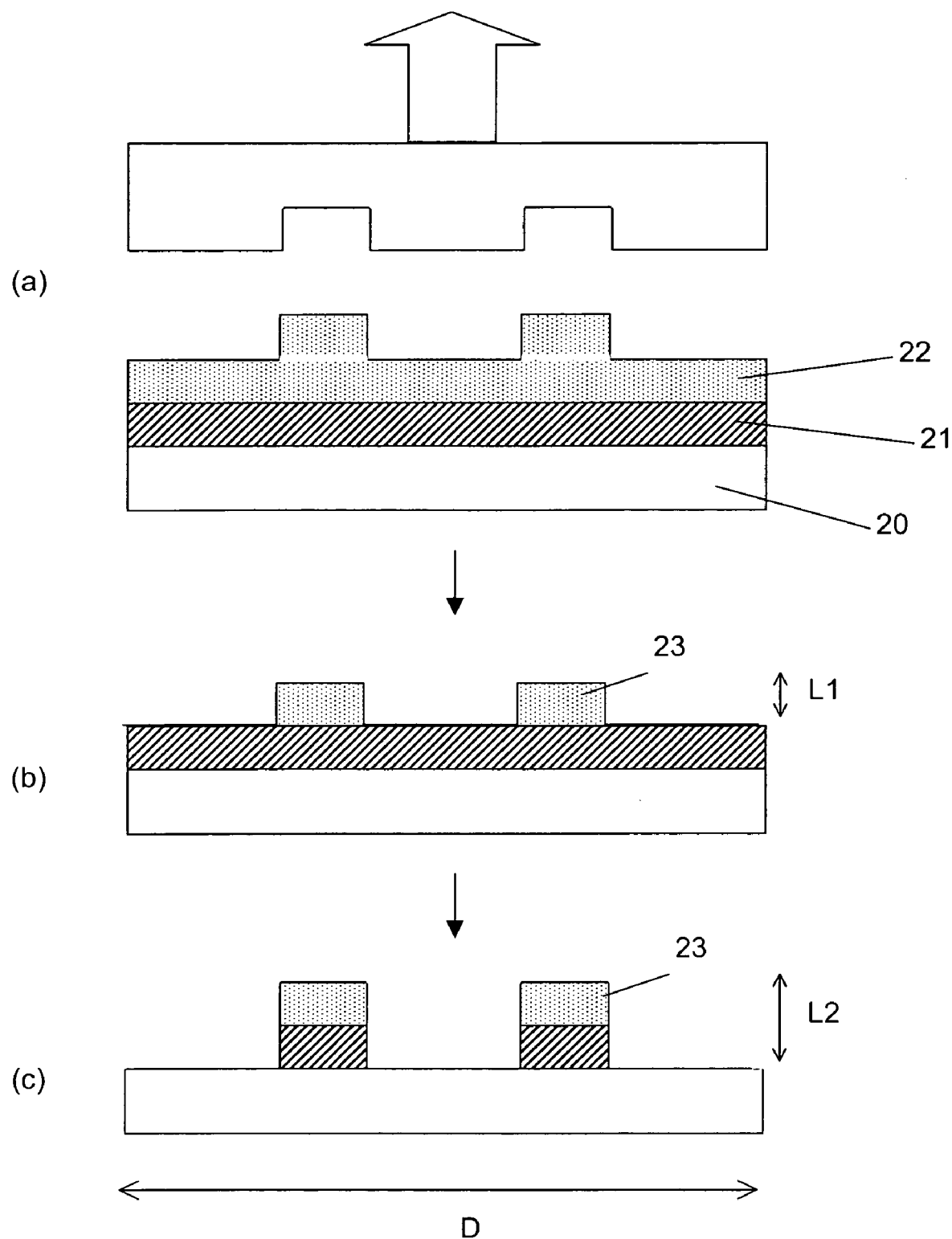
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as will be described below.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure required for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylatee. In general, any photopolymerisable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerise and thus cure it. Upon removal of the template, the remaining steps of etching the residual layer of resist are the same or similar as for the hot embossing process described above. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description above, and below, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made above to depositing UV curable liquids onto a substrate, the liquids could also be deposited on the template and in general the same techniques and considerations will apply.

Figure 3:
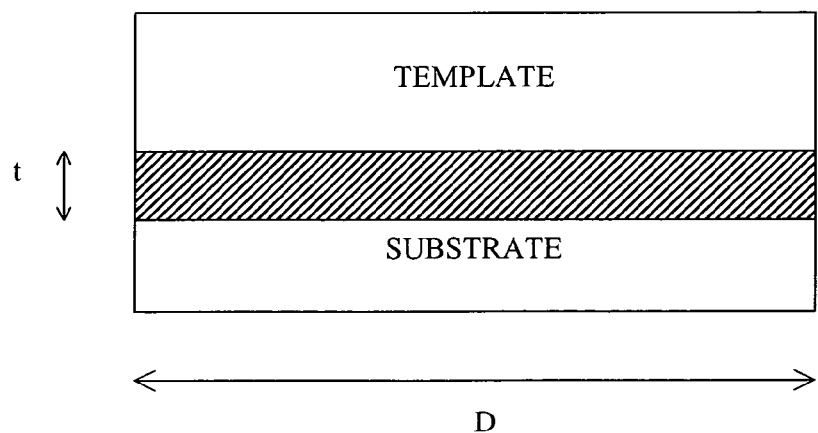
FIG. 3 illustrates relative dimensions of template features compared to the thickness of a typical imprintable resist layer deposited on a substrate.

FIG. 3 illustrates the relative dimensions of the template, imprintable material (curable monomer, thermosetting resin, thermoplastic, etc.), and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer of imprintable material left after stamping is useful in protecting the underlying substrate, but may also impact obtaining high resolution and/or overlay accuracy. The first 'breakthrough' etch is isotropic (non-selective) and will thus to some extent erode the features imprinted as well as the residual layer. This may be exacerbated if the residual layer is overly thick and/or uneven.

This etching may, for instance, lead to a variation in the thickness of features ultimately formed on the underlying substrate (i.e. variation in the critical dimension). The uniformity of the thickness of a feature that is etched in the transfer layer in the second anisotropic etch is dependant upon the aspect ratio and integrity of the shape of the feature left in the resin. If the residual resin layer is uneven, then the non-selective first etch may leave some of these features with "rounded" tops so that they are not sufficiently well defined to ensure good uniformity of feature thickness in the second and any subsequent etch process.

In principle, the above problem may be reduced by ensuring the residual layer is as thin as possible but this may require application of undesirably large pressures (possibly increasing substrate deformation) and relatively long imprinting times (perhaps reducing throughput).

As noted above, the resolution of the features on the template surface is a limiting factor on the attainable resolution of features printed on the substrate. The templates used for hot and UV imprint lithography are generally formed in a two-stage process. Initially, the required pattern is written using, for example, electron beam writing to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be desired as the template is effectively a 1× mask with the resolution of the transferred pattern being limited by the resolution of the pattern on the template.

The release characteristics of the template are also a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the imprintable medium, and in the case of hot imprint lithography, it may also be subjected to high pressure and temperature. The force, pressure and/or temperature may cause wearing of the template, and may adversely affect the shape of the pattern imprinted upon the substrate.

In hot imprint lithography, a potential advantage may be realized in using a template of the same or similar material to the substrate to be patterned in order to help reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disk magnetic media, flat panel displays, thin-film magnetic heads, etc.

While in the description above particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non linear response, etc. For example, the functional material may form a conductive layer, a semiconductive layer, a dielectric layer or a layer having another desirable mechanical, electrical or optical property. Some organic substances may also be appropriate functional materials. Such applications may be within the scope of one or more embodiments of the invention.

In imprint processes, it may be difficult to provide the exact dosage of imprintable material (e.g., resin) required for printing since it depends upon the precise nature of the template pattern and on the thickness of the residual layer to be formed. More imprintable material than necessary will typically be applied to ensure that the dosage does not have to be closely monitored and adjusted for different template patterns, and to ensure that all the recessed pattern features defined by the template are completely filled with the imprintable material to accurately reproduce the pattern in the imprintable material and to maximize the aspect ratio of the printed features. Consequently, when the template is forced into the imprintable material, excess imprintable material is forced out around the edges of the template. Thus, not only imprintable material but also areas of the substrate immediately surrounding the patterned area may be wasted, which waste may be a significant problem in step and repeat process. For example, in current IC manufacturing processes, adjacent ICs are separated by approximately 40 microns. Imprint lithography processes employ relatively low viscosity imprintable media and are therefore likely to lead to increases in the amount of substrate area and imprintable medium wasted during imprinting.

Figure 6:
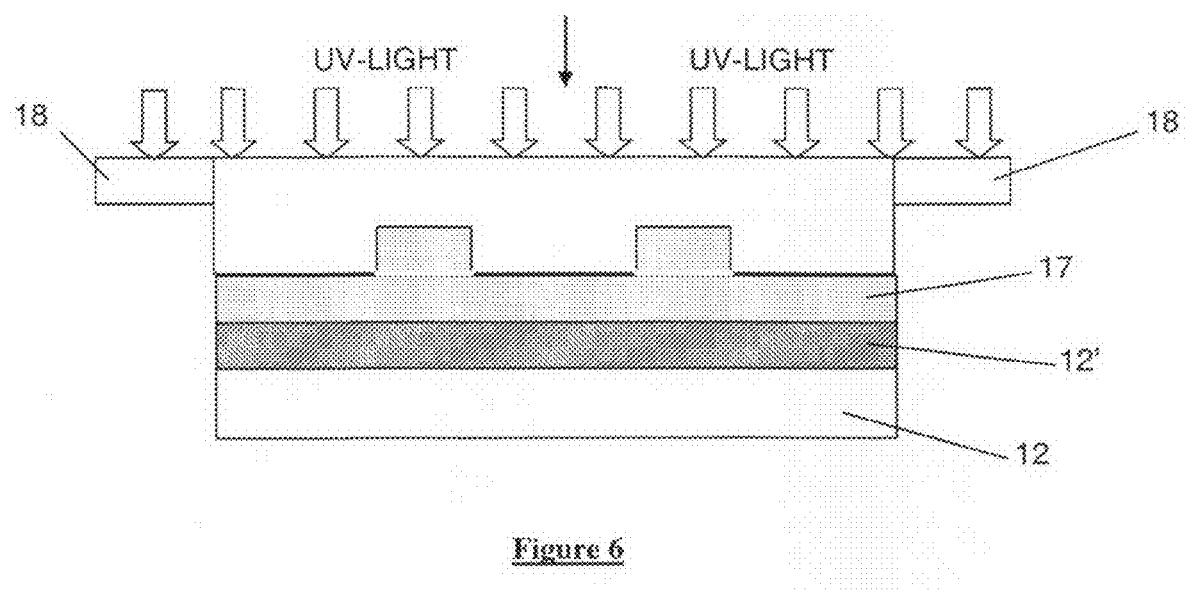
FIG. 6 illustrates a shield provided at the periphery of the template.

Curing of the excess material squeezed out around the edges of the template should be avoided since this will render it difficult to remove. Thus, in an embodiment of the invention described below, appropriate UV and/or thermal shielding is provided at the periphery of the template, as shown in FIG. 6, to help ensure any imprintable material outside the printed area remains in an uncured flowable state. The nature and arrangement of the shielding is conventional and therefore will not be further described. For example, FIG. 6 shows a shield 18 provided at the periphery of the template.

Figure 4:
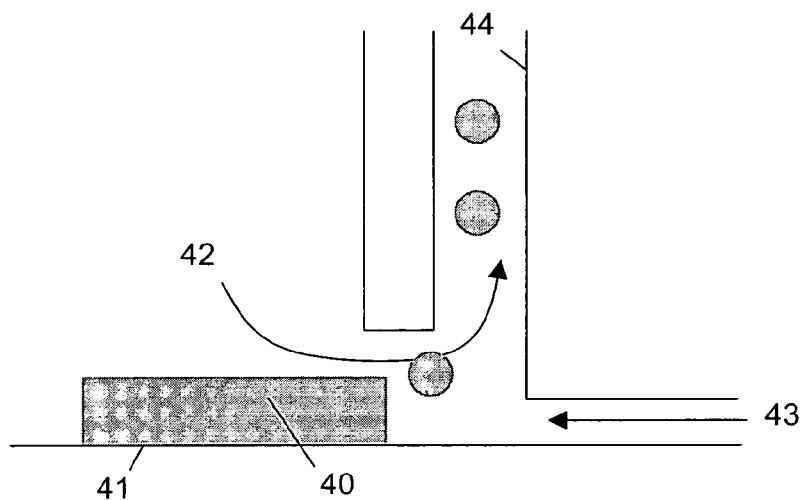
FIG. 4 illustrates a gas knife configured to remove excess imprintable material in accordance with an embodiment of the invention.

Referring to FIG. 4, a gas knife is provided that is passed along one or more edges of the printed area (not shown) after curing to remove uncured excess imprintable material 40 on the substrate surface 41. One or more high pressure gas inputs are provided at the edge(s) of the excess imprintable material 40 to direct one or more streams of high pressure gas (e.g., air) towards the excess imprintable material 40 in the direction of arrows 42 and/or 43, and a low pressure channel 44 is provided, for example, between the two gas inputs. In the embodiment shown in FIG. 4, two gas inputs are provided to created gas flows in the directions of arrows 42 and 43 respectively with the low pressure channel 44 at or near the intersection of the gas flows. The pressure difference causes the excess imprintable material 40 to break up by attrition and be "blown" out via the low pressure channel 44. According to an embodiment, the gas knife may be a structure disposed around the perimeter of a printing template or a separate entity which can move freely around the printed area to remove excess imprintable material as it is detected.

In a conventional apparatus, one or more gas bearings incorporating one or more high pressure gas conduits are used, for example, to facilitate movement of a substrate holder. It is therefore envisaged that the gas knife may be conveniently connected to the gas source for such a gas bearing or incorporated into such a gas bearing. In an embodiment, providing two high pressure gas inputs may eliminate unbalanced forces which might arise due to the transport of a gas-liquid mixture, thereby reducing or avoiding alignment or overlay errors.

Figure 5:
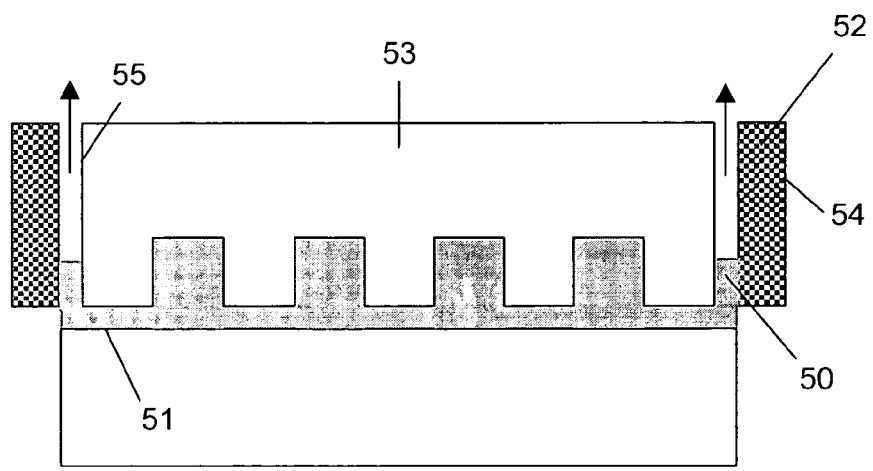
FIG. 5 illustrates a suction device configured to remove excess imprintable material in accordance with an embodiment of the invention.

According to an embodiment of the invention illustrated in FIG. 5, excess imprintable material 50 is removed from a substrate surface 51 using a suction device 52 (only a part of which is shown) connected to a template 53. In an embodiment, the suction device 52 comprises a peripheral structure 54 (which may be of a circular, rectangular or any other appropriate shape) arranged around the periphery of the printing area to define a channel 55 within which negative pressure is applied. After the printed area has been cured, the suction device 52 is activated to break up and remove uncured excess imprintable material 50 as the template 53 moves to the next printing location, in a similar way to the gas knife embodiment of FIG. 4. This embodiment may also easily be connected to or incorporated in to a gas bearing, for example, upon which the printing apparatus is mounted.

While specific embodiments of the invention have been described above, it will be appreciated that the invention may be practiced otherwise than as described. The description is not intended to limit the invention.

We claim:

1. An imprinting method, comprising:
   contacting a flowable imprintable medium on a substrate with a template to define an imprint area in the medium, the contact causing at least some of the flowable imprintable medium to flow outside the imprint area;
   shielding at least some of the flowable imprintable medium present outside the imprint area from being converted to a substantially non-flowable state;
   separating the at least some of the flowable imprintable medium present outside the imprint area from the substrate by subjecting the at least some of the flowable imprintable medium to a suction force; and
   separating the template from the medium.

2. The method according to claim 1, further comprising providing a volume of the imprintable medium on the substrate.

3. The method according to claim 1, further comprising converting a region of the medium within the imprint area from a flowable state to a substantially non-flowable state while the medium is contacted by the template.

4. The method according to claim 3, wherein separating the imprintable medium outside the imprint area is effected during conversion of the region of the medium from a flowable state to a substantially non-flowable state.

5. The method according to claim 3, wherein separating the imprintable medium outside the imprint area is effected after conversion of the region of the medium from a flowable state to a substantially non-flowable state.

6. The method according to claim 3, wherein separating the imprintable medium outside the imprint area is effected prior to separating the template from the medium.

7. The method according to claim 1, further comprising converting only the medium within the imprint area from a flowable state to a substantially non-flowable state while the medium is contacted by the template.

8. The method according to claim 7, wherein separating the imprintable medium outside the imprint area from the substrate is effected during conversion of the medium within the imprint area from a flowable state to a substantially non-flowable state.

9. The method according to claim 7, wherein separating the imprintable medium outside the imprint area from the substrate is effected after conversion of the medium within the imprint area from a flowable state to a substantially non-flowable state.

10. The method according to claim 7, wherein separating the imprintable medium outside the imprint area from the substrate is effected prior to separating the template from the medium.

11. The method according to claim 1, wherein separating the imprintable medium outside the imprint area from the substrate is effected after initially contacting the medium with the template.

12. The method according to claim 1, wherein separating the imprintable medium outside the imprint area from the substrate is effected by directing a stream of high pressure fluid at the imprintable medium outside the imprint area.

13. The method according to claim 12, further comprising directing separated imprintable medium along a low pressure conduit.

14. The method according to claim 1, wherein a first volume of the medium is imprinted to define a first imprint area and then a second volume of the medium is imprinted, and separating imprintable medium outside the first imprint area from the substrate is effected after separating the template from the first volume and before contacting the second volume with the template.

15. The method according to claim 1, further comprising providing the suction force around a periphery of the imprint area.

16. The method according to claim 15, further comprising providing the suction force within a channel arranged around the periphery of the imprint area.

17. An imprinting apparatus, comprising:
   a substrate holder configured to hold a substrate having thereon a flowable imprintable medium;
   a template holder configured to cause a template supported by the template holder to contact the medium to define an imprint area in the medium and to cause the template to separate from the medium;
   a shield configured to shield the flowable imprintable medium present outside the imprint area after contact by the template from being converted to a substantially non-flowable state; and
   a removal apparatus configured to separate at least some of the flowable imprintable medium present outside the imprint area from the substrate, the removal apparatus including a suction device arranged to apply a suction force to the at least some of the flowable imprintable medium present outside the imprint area.

18. The apparatus according to claim 17, further comprising a dosing apparatus configured to provide a volume of imprintable medium on the substrate.

19. The apparatus according to claim 17, wherein the removal apparatus comprises a high pressure channel and a low pressure channel, the high and low pressure channels, when in use, configured to intersect adjacent a region of the imprintable medium present outside the imprint area.

20. The apparatus according to claim 19, wherein a pressure difference at an intersection of the high and low pressure channels causes at least some of the imprintable medium present outside the imprint area to break.

21. The apparatus according to claim 17, wherein the removal apparatus is fixed relative to the template.

22. The apparatus according to claim 17, wherein the removal apparatus is movable independently of the template.

23. The apparatus according to claim 17, wherein the shield is configured to provide UV or thermal shielding to the at least some of the imprintable medium present outside the imprint area.

24. The apparatus according to claim 17, wherein the removal apparatus comprises a peripheral structure arranged around the periphery of the imprint area.

25. The apparatus according to claim 24, wherein the removal apparatus is movable around the imprint area to remove excess imprintable material.

26. The apparatus according to claim 24, wherein the removal apparatus defines a channel within which the suction force is applied.

* * * * *